United States Patent
Fujita (10) Patent No.: US 10,531,565 B2
(45) Date of Patent: Jan. 7, 2020

(54) MULTILAYER CAPACITOR BUILT-IN SUBSTRATE

(71) Applicant: Murata Manufacturing Co., Ltd., Nagaokakyo-shi, Kyoto-fu (JP)

(72) Inventor: Yukihiro Fujita, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/830,233

(22) Filed: Dec. 4, 2017

(65) Prior Publication Data

US 2018/0160541 A1 Jun. 7, 2018

(30) Foreign Application Priority Data

Dec. 5, 2016 (JP) .................................. 2016-235742

(51) Int. Cl.
*H05K 1/02* (2006.01)
*H05K 1/11* (2006.01)
(Continued)

(52) U.S. Cl.
CPC ............ *H05K 1/186* (2013.01); *H01G 4/248* (2013.01); *H01G 4/30* (2013.01); *H01G 4/012* (2013.01);
(Continued)

(58) Field of Classification Search
CPC ... H05K 1/02; H05K 1/11; H05K 1/16; H05K 1/18; H05K 1/185; H05K 1/186;
(Continued)

(56) References Cited

U.S. PATENT DOCUMENTS 6,370,013 B1 * 4/2002 Iino ...................... H01G 4/2325
257/E23.062
9,786,434 B2 * 10/2017 Choi ......................... H01G 4/12
(Continued)

FOREIGN PATENT DOCUMENTS

CN 103971929 A 8/2014
JP 2015-065414 A 4/2015
(Continued)

OTHER PUBLICATIONS

Hattori et al., "Electronic Component Containing Substrate," U.S. Appl. No. 15/444,425, filed Feb. 28, 2017.

*Primary Examiner* — Xiaoliang Chen
(74) *Attorney, Agent, or Firm* — Keating & Bennett, LLP (57) ABSTRACT

A multilayer capacitor built-in substrate includes a core substrate, a multilayer capacitor mounted on one principal surface of the core substrate, and a burying layer provided on the one principal surface of the core substrate to bury the multilayer capacitor. The multilayer capacitor includes a laminated body in which dielectric layers and internal electrode layers are laminated, and first and second external electrodes. The laminated body includes an effective region in which internal electrode layers respectively connected to the first external electrode and the second external electrode are laminated with a dielectric layer located therebetween, and a non-effective region surrounding the effective region. The core substrate includes, on the one principal surface, a first land electrode electrically connected to the first external electrode and a second land electrode electrically connected to the second external electrode.

15 Claims, 10 Drawing Sheets

(51) Int. Cl.

| | |
|---|---|
| *H05K 1/16* | (2006.01) |
| *H05K 1/18* | (2006.01) |
| *H01G 4/08* | (2006.01) |
| *H01G 4/12* | (2006.01) |
| *H01G 4/30* | (2006.01) |
| *H01G 4/38* | (2006.01) |
| *H01G 4/228* | (2006.01) |
| *H01G 4/232* | (2006.01) |
| *H01G 2/02* | (2006.01) |
| *H01G 2/06* | (2006.01) |
| *H01G 4/248* | (2006.01) |
| *H01G 4/012* | (2006.01) |

(52) U.S. Cl.
CPC . *H01G 4/1227* (2013.01); *H05K 2201/10015* (2013.01)

(58) Field of Classification Search
CPC .. H01G 4/05; H01G 4/08; H01G 4/12; H01G 4/30; H01G 4/38; H01G 4/228; H01G 4/232; H01G 2/02; H01G 2/06
USPC ..... 174/260, 254, 257, 258; 361/303.4, 304, 361/527, 529, 761, 767
See application file for complete search history.

(56) References Cited

U.S. PATENT DOCUMENTS

| | | | | |
|---|---|---|---|---|
| 9,824,824 | B2* | 11/2017 | Park | H01G 4/248 |
| 9,837,218 | B2* | 12/2017 | Shin | H01G 15/00 |
| 9,847,177 | B2* | 12/2017 | Shin | H01G 4/38 |
| 9,877,381 | B2* | 1/2018 | Son | H05K 1/0231 |
| 9,881,736 | B2* | 1/2018 | Park | H01G 2/065 |
| 2006/0158825 | A1* | 7/2006 | Hidaka | H01G 4/012 361/303 |
| 2006/0198079 | A1* | 9/2006 | Shim | H01G 2/06 361/306.3 |
| 2007/0158101 | A1* | 7/2007 | Chikagawa | H05K 1/186 174/260 |
| 2009/0259265 | A1* | 10/2009 | Stevenson | A61N 1/0556 607/2 |
| 2012/0018204 | A1* | 1/2012 | Sato | H01G 4/232 174/260 |
| 2012/0033342 | A1* | 2/2012 | Ito | H01G 4/224 361/301.4 |
| 2012/0168207 | A1* | 7/2012 | Oh | H01G 4/005 174/254 |
| 2014/0116761 | A1* | 5/2014 | Lee | H01G 4/30 174/258 |
| 2014/0131082 | A1* | 5/2014 | Ahn | H05K 3/3442 174/260 |
| 2014/0138136 | A1* | 5/2014 | Ahn | H01G 2/065 174/260 |
| 2014/0174800 | A1* | 6/2014 | Chang | H05K 1/185 174/257 |
| 2014/0209363 | A1 | 7/2014 | Oh et al. | |
| 2014/0262463 | A1* | 9/2014 | Lee | H05K 1/183 174/260 |
| 2015/0021077 | A1* | 1/2015 | Chae | H01G 4/30 174/260 |
| 2015/0021080 | A1* | 1/2015 | Lee | H01G 4/005 174/260 |
| 2015/0028912 | A1* | 1/2015 | Cho | G01R 1/07378 324/756.07 |
| 2015/0041196 | A1* | 2/2015 | Kim | H01G 4/30 174/260 |
| 2015/0041198 | A1* | 2/2015 | Lee | H01G 2/06 174/260 |
| 2015/0041199 | A1* | 2/2015 | Lee | H01G 4/005 174/260 |
| 2015/0053472 | A1* | 2/2015 | Lee | H05K 1/185 174/260 |
| 2015/0060122 | A1* | 3/2015 | Lee | H05K 1/185 174/260 |
| 2015/0062775 | A1* | 3/2015 | Shibasaki | H01G 4/30 361/301.4 |
| 2015/0068792 | A1* | 3/2015 | Cho | H01G 4/12 174/258 |
| 2015/0075853 | A1* | 3/2015 | Lee | H01G 2/06 174/260 |
| 2015/0098202 | A1* | 4/2015 | Lee | H01G 4/30 361/761 |
| 2015/0109718 | A1* | 4/2015 | Choi | H01G 2/06 361/304 |
| 2015/0122535 | A1* | 5/2015 | Lee | H01G 4/30 174/260 |
| 2015/0325375 | A1* | 11/2015 | Song | H01G 2/02 174/260 |
| 2015/0380161 | A1* | 12/2015 | Lim | H01G 4/30 361/301.4 |
| 2016/0020024 | A1* | 1/2016 | Shin | H01G 9/052 174/260 |
| 2016/0020031 | A1* | 1/2016 | Shin | H01G 4/38 174/260 |
| 2016/0020032 | A1* | 1/2016 | Shin | H01G 4/38 174/260 |
| 2016/0020033 | A1* | 1/2016 | Shin | H01G 4/38 174/260 |
| 2016/0020041 | A1* | 1/2016 | Ahn | H01G 15/00 363/21.01 |
| 2016/0027593 | A1* | 1/2016 | Ahn | H01G 4/38 361/301.4 |
| 2016/0027594 | A1* | 1/2016 | Ahn | H01G 15/00 361/767 |
| 2016/0172125 | A1* | 6/2016 | Shin | H01G 15/00 361/529 |
| 2016/0189868 | A1 | 6/2016 | Sasaki et al. | |
| 2016/0205769 | A1* | 7/2016 | Park | H01G 4/224 174/260 |
| 2016/0211075 | A1* | 7/2016 | Park | H01G 2/065 |
| 2016/0309578 | A1* | 10/2016 | Park | H01G 4/30 |
| 2017/0099727 | A1* | 4/2017 | Son | H01G 2/065 |
| 2017/0196092 | A1* | 7/2017 | Choi | H01G 4/0085 |
| 2017/0287853 | A1* | 10/2017 | Kim | H01L 23/3114 |

FOREIGN PATENT DOCUMENTS

| | | |
|---|---|---|
| JP | 2015-226026 A | 12/2015 |
| JP | 2016-127045 A | 7/2016 |

* cited by examiner

United States Patent No. 10,531,565 B2

MULTILAYER CAPACITOR BUILT-IN SUBSTRATE

CROSS REFERENCE TO RELATED APPLICATIONS

This application claims the benefit of priority to Japanese Patent Application No. 2016-235742 filed on Dec. 5, 2016. The entire contents of this application are hereby incorporated herein by reference.

BACKGROUND OF THE INVENTION

1. Field of the Invention

The present invention relates to a multilayer capacitor built-in substrate.

2. Description of the Related Art

In recent years, as the performance of electronic devices has been increased, the capacitance of multilayer ceramic capacitors has been increased progressively.

In the case of high-capacitance multilayer ceramic capacitors, high dielectric constant ceramic materials such as barium titanate, have been used as a dielectric material.

These high dielectric constant ceramic materials include piezoelectric and electrostrictive properties, and thus, in multilayer ceramic capacitors including dielectrics composed of the high dielectric constant ceramic materials, mechanical distortion will be produced when a voltage is applied.

Therefore, when an alternating-current voltage or a direct-current voltage with an alternating-current component superimposed thereon is applied to the multilayer ceramic capacitors mounted on circuit boards, vibrations will be generated in the multilayer ceramic capacitor due to distortion of the multilayer ceramic capacitors, and the vibrations will propagate to the circuit boards, thereby vibrating the circuit boards.

In this regard, when the circuit board vibrates at a frequency of 20 Hz to 20,000 Hz in the audible frequency range due to the propagated vibration, noise referred to as "acoustic noise" will be generated.

Various proposals have been made as techniques to reduce the noise described above. For example, in the multilayer ceramic capacitor described in Japanese Patent Application Laid-Open No. 2015-65414, a capacitor main body integrally includes a capacitance part, an upper protection part, and a lower protection part, and the thickness of the lower protection part is larger than the thickness of the upper protection part so that the capacitance part is positioned on the upper side in the height direction of the capacitor main body. In addition, in the multilayer ceramic capacitor described in Japanese Patent Application Laid-Open No. 2015-226026, a capacitor main body includes a first protection part, a capacitance part, an electrostrictive relaxation part, a characteristic adjustment part, and a second protection part provided in layers in the height direction, and when the thickness of the capacitance part, the thickness of the electrostrictive relaxation part, and the thickness of the characteristic adjustment part are denoted respectively by T2, T3, and T4, the condition of T2>T3>T4 is satisfied. Furthermore, in the multilayer ceramic capacitor described in Japanese Patent Application Laid-Open No. 2016-127045, a capacitor main body includes a first protection part, a capacitance part, and a second protection part provided in layers in this order in the height direction, the capacitor part includes a high capacitance part and a low capacitance part continuously in the height direction, and the opposed interval between n2 layers of internal electrode layers included in the low capacitance part is larger than the opposed interval between n1 layers of internal electrode layers included in the high capacitance part.

In recent years, electronic component built-in substrates have been proposed in which electronic components such as, multilayer ceramic capacitors, are buried in the substrates, thereby achieving reductions in substrate thickness. However, when the multilayer ceramic capacitors described in Japanese Patent Application Laid-Open No. 2015-65414, Japanese Patent Application Laid-Open No. 2015-226026, and Japanese Patent Application Laid-Open No. 2016-127045 are mounted on substrates, and the multilayer ceramic capacitors are buried in burying layers including a resin, the burying layers are also believed to propagate distortion of the multilayer ceramic capacitors to the substrates. As a result, there is a concern that the vibrations of the substrates will be increased, thereby making it difficult to suppress acoustic noise.

SUMMARY OF THE INVENTION

Preferred embodiments of the present invention provide multilayer capacitor built-in substrates that are able to significantly reduce or prevent acoustic noise.

A multilayer capacitor built-in substrate according to a preferred embodiment the present invention is a multilayer capacitor built-in substrate including a core substrate, a multilayer capacitor mounted on one principal surface of the core substrate, and a burying layer provided on the one principal surface of the core substrate to bury the multilayer capacitor. The multilayer capacitor includes a laminated body with a plurality of dielectric layers and a plurality of internal electrode layers laminated, a first external electrode, and a second external electrode. The laminated body includes a first principal surface opposed in a thickness direction orthogonal or substantially orthogonal to the one principal surface of the core substrate, a second principal surface opposed in the thickness direction orthogonal or substantially orthogonal to the one principal surface of the core substrate and opposed to the one principal surface of the core substrate, a first end surface and a second end surface opposed in a length direction orthogonal or substantially orthogonal to the thickness direction, and a first side surface and a second side surface opposed in a width direction orthogonal or substantially orthogonal to the thickness direction and the length direction. The first external electrode is provided on the first end surface of the laminated body and electrically connected to at least some of the internal electrode layers of the plurality of internal electrode layers, and the second external electrode is provided on the second end surface of the laminated body and electrically connected to at least some of the internal electrode layers of the plurality of internal electrode layers The laminated body includes an effective region where the internal electrode layers respectively connected to the first external electrode and the second external electrode are laminated with the dielectric layers located therebetween, and a non-effective region surrounding the effective region. The core substrate includes on the one principal surface, a first land electrode electrically connected to the first external electrode, and a second land electrode electrically connected to the first external electrode. A thickness $T_R$ of the burying layer is larger than a thickness $T_B$ of the core substrate, and $T_C<L_L/4$ is satisfied when a distance between the first land electrode and the second land electrode in the length direction is denoted by $L_L$, and a height of a center of the effective region with the second principal surface of the laminated body as a reference plane is denoted by $T_C$.

According to a preferred embodiment of the present invention, the height $T_C$ of the center of the effective region is about ¼ or less of the thickness $T_R$ of the burying layer.

According to a preferred embodiment of the present invention, the value of T/W is preferably about ¾ or less when a thickness of the laminated body and a width of the laminated body are denoted respectively T and W.

According to a preferred embodiment of the present invention, the thickness T of the laminated body is preferably about 0.33 mm or less.

According to a preferred embodiment of the present invention, the thickness $T_a$ of the non-effective region closer to the second principal surface is smaller than the thickness $T_b$ of the non-effective region closer to the first principal surface.

Preferred embodiments of the present invention provide multilayer capacitor built-in substrates that are able to significantly reduce or prevent acoustic noise.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

In multilayer capacitor built-in substrates according to preferred embodiments of the present invention, a thickness $T_R$ of a burying layer is larger than a thickness $T_B$ of a core substrate. Furthermore, $T_C<L_L/4$ is satisfied when the distance between a first land electrode and a second land electrode in the length direction is denoted by $L_L$, and the height of the center of an effective region with a second principal surface of a laminated body as a reference plane is denoted by $T_C$.

Multilayer capacitor built-in substrates according to the preferred embodiments of the present invention will be described below.

However, the preferred embodiments of the present invention are not to be considered limited to the following specific features, elements, and components, but are able to be applied with changes appropriately made without changing the scope of the present invention. It is to be noted that the preferred embodiments of the present invention also encompass combinations of two or more individual preferred embodiments of the present invention as described below.

The following respective preferred embodiments of the present invention are considered by way of example, and it is possible to partially substitute or combine specific features, elements, and components presented in different preferred embodiments with one another. In a second preferred embodiment and the subsequent sections, descriptions of common matters with a first preferred embodiment will be omitted, and only differences will be described. Particularly, the similar features and effects provided by similar features, elements, and components will not be mentioned sequentially for each preferred embodiment.

In the following preferred embodiments of the present invention, cases where the multilayer capacitor is a multilayer ceramic capacitor will be described, but the dielectric material of the multilayer capacitor is not limited to any ceramic material as long as distortion is able to be generated by application of a voltage. For example, preferred embodiments of the present invention are able to be also applied to a multilayer-type metallized film capacitor, which is a multilayer capacitor that includes a resin material as a dielectric material other than a ceramic material.

First Preferred Embodiment

According to a first preferred embodiment of the present invention, the height $T_C$ of the center of the effective region is about ¼ or less of the thickness $T_R$ of the burying layer, for example.

Figure 1:
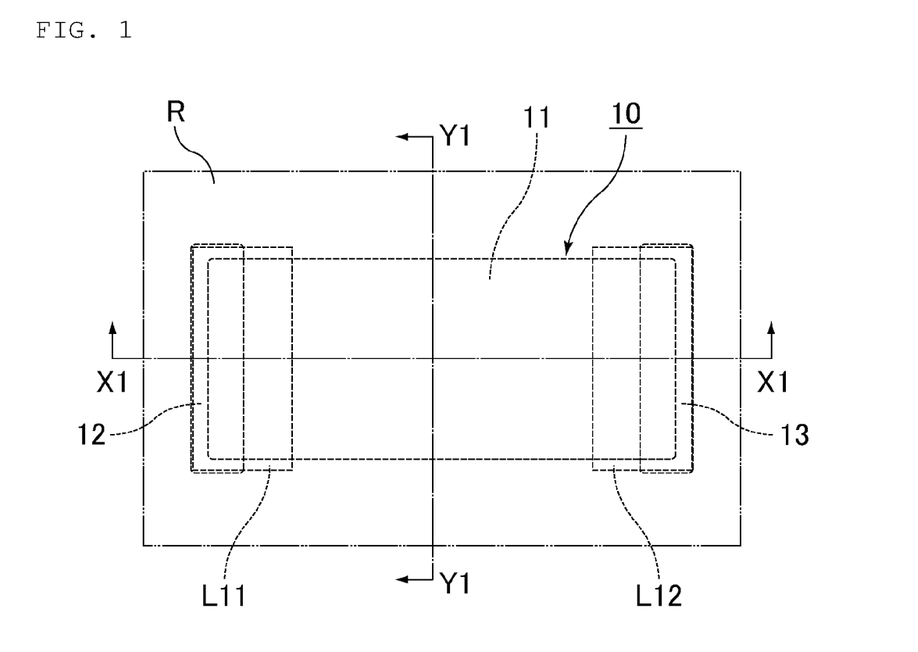
FIG. 1 is a top view schematically illustrating a multilayer capacitor built-in substrate according to a preferred embodiment of the present invention.

FIG. 1 is a top view schematically illustrating a multilayer capacitor built-in substrate according to a preferred embodiment the present invention.

Figure 2:
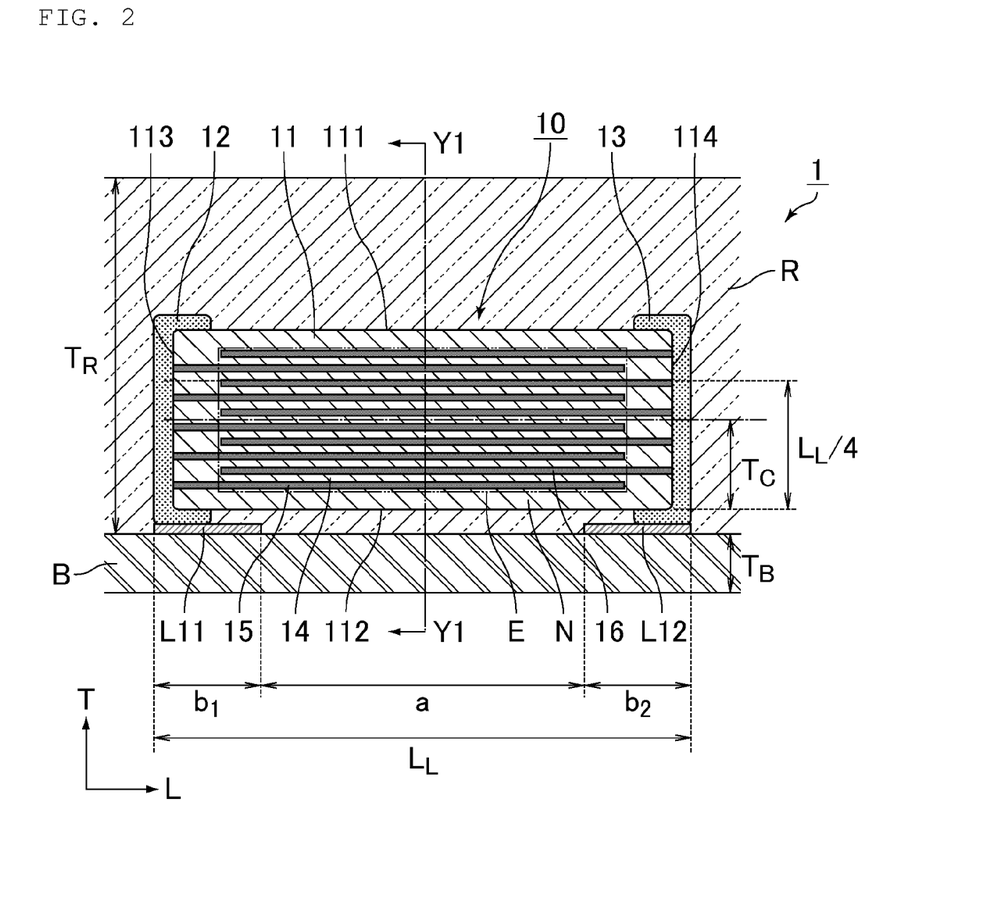
FIG. 2 is a cross-sectional view taken along the line X1-X1 of a multilayer capacitor built-in substrate according to a first preferred embodiment of the present invention.
Figure 3:
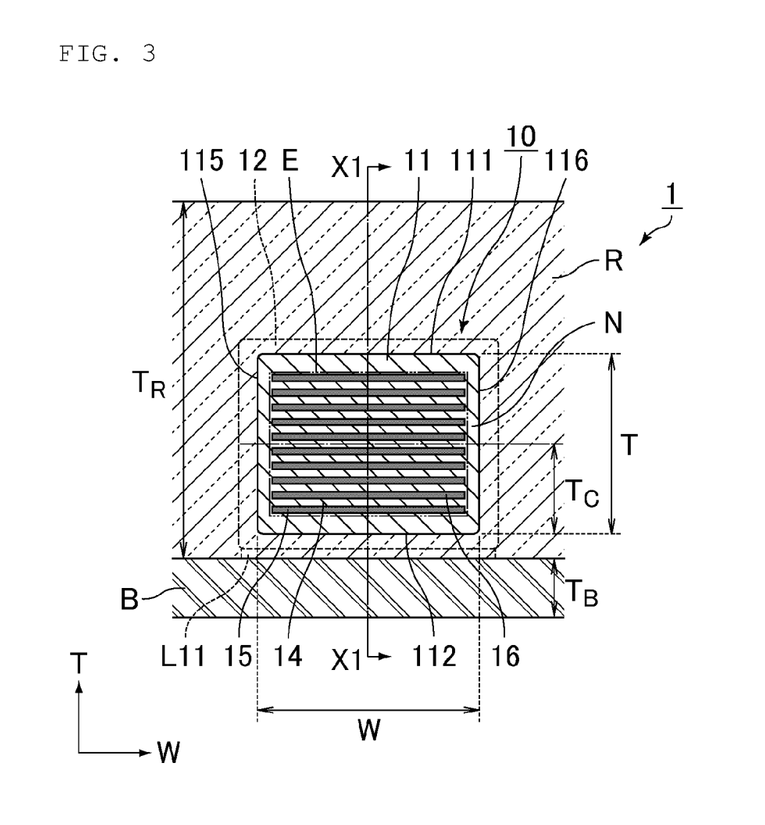
FIG. 3 is a cross-sectional view taken along the line Y1-Y1 of the multilayer capacitor built-in substrate according to the first preferred embodiment of the present invention.

FIG. 2 is a cross-sectional view taken along the line X1-X1 of a multilayer capacitor built-in substrate according to a first preferred embodiment of the present invention. FIG. 3 is a cross-sectional view taken along the line Y1-Y1 of the multilayer capacitor built-in substrate according to the first preferred embodiment. It is to be noted that FIG. 2 corresponds to the cross-sectional view taken along the line X1-X1 of the multilayer capacitor built-in substrate shown in FIG. 1, and FIG. 3 corresponds to the cross-sectional view taken along the line Y1-Y1 of the multilayer capacitor built-in substrate shown in FIG. 1.

The multilayer capacitor built-in substrate 1 shown in FIGS. 2 and 3 includes a core substrate B, a multilayer ceramic capacitor 10, and a burying layer R. The multilayer ceramic capacitor 10 is mounted on one principal surface of a core substrate B that includes one principal surface and the other principal surface parallel or substantially parallel to each other within the error range. The burying layer R is provided on one principal surface of the core substrate B to bury the multilayer ceramic capacitor 10, and to cause the outer surface to be parallel or substantially parallel to the other principal surface of the core substrate B within the error range.

The length direction L, the width direction W, and the thickness direction T of the multilayer ceramic capacitor 10 are shown in FIGS. 2 and 3. In this regard, the length direction L, the width direction W, and the thickness direction T are orthogonal or substantially orthogonal to each other. The thickness direction T is a direction orthogonal or substantially orthogonal to one principal surface of the core substrate B.

In the multilayer capacitor built-in substrate 1 shown in FIGS. 2 and 3, the burying layer R includes a resin material portion.

The resin material portion includes a resin material that includes a glass material, silica, or the like dispersed as a filler. Although not shown in FIGS. 2 and 3, the burying layer R may further include, in addition to the resin material portion, a conductive material portion provided on the surface of the resin material portion.

The core substrate B is provided, on one principal surface thereof, with a first land electrode L11 and a second land electrode L12. The core substrate B is, for example, a multilayer substrate, and shown in a simplified fashion without internal electrodes, vias, etc. shown. It is to be noted that in FIGS. 2 and 3, in order to highlight the multilayer ceramic capacitor 10, the relationship between the sizes of the core substrate B and the multilayer ceramic capacitor 10 is different from the actual relationship.

The multilayer ceramic capacitor 10 includes a laminated body 11 in which a plurality of dielectric layers 14 and a plurality of internal electrode layers 15 or 16 are alternately laminated, and a first external electrode 12 and a second external electrode 13 provided on the laminated body 11 and located on surfaces at both ends in the length direction L. According to the present preferred embodiment, the multilayer ceramic capacitor preferably includes two external electrodes, for example. However, multilayer capacitor built-in substrates according to other preferred embodiments of the present invention, the multilayer capacitor may include at least two external electrodes.

According to the present preferred embodiment, the laminating direction of the dielectric layers 14 and the internal electrode layers 15 or 16 is orthogonal or substantially orthogonal to the length direction L and the width direction W of the multilayer ceramic capacitor 10. More specifically, the laminating direction of the dielectric layers 14 and the internal electrode layers 15 or 16 is parallel or substantially parallel to the thickness direction T of the multilayer ceramic capacitor 10.

The laminated body 11 includes a first principal surface 111 opposed in the thickness direction T, a second principal surface 112 opposed in the thickness direction T, and opposed to one principal surface of the core substrate B, a first end surface 113 and a second end surface 114 opposed to each other in the length direction L orthogonal or substantially orthogonal to the thickness direction T, and a first side surface 115 and a second side surface 116 opposed in the width direction W orthogonal or substantially orthogonal to the thickness direction T and the length direction L.

The laminated body 11 includes a cuboid or substantially cuboid outer shape, and may include at least one of corners and ridges rounded. The corner refers to the intersection of three surfaces of the laminated body, and the ridge refers to the intersection of two surfaces of the laminated body.

The first external electrode 12 and the second external electrode 13 are located on the surfaces at both ends in the length direction L.

Specifically, the first external electrode 12 is provided on the first end surface 113 of the laminated body 11, and extends from the first end surface 113 to respective portions of the first principal surface 111, the second principal surface 112, the first side surface 115, and the second side surface 116, and the second external electrode 13 is provided on the second end surface 114 of the laminated body 11, and extends from the second end surface 114 to respective portions of the first principal surface 111, the second principal surface 112, the first side surface 115, and the second side surface 116.

As shown in FIG. 2, of the mutually opposed internal electrode layers 15 and 16, one internal electrode layer 15 is electrically connected to the first external electrode 12 at the first end surface 113, and the other internal electrode layer 16 is electrically connected to the second external electrode 13 at the second end surface 114. More specifically, the first external electrode 12 is electrically connected to the one internal electrode layers 15 at the first end surface 113, and the second external electrode 13 is electrically connected to the other internal electrode layers 16 at the second end surface 114.

According to the present preferred embodiment, the internal electrode layers 15 and 16 are all electrically connected respectively to the first external electrode 12 and the second external electrode 13. However, in multilayer capacitor built-in substrates according to other preferred embodiments of the present invention, at least some of the plurality of internal electrode layers may be electrically connected to the first external electrode or the second external electrode. More specifically, the plurality of internal electrode layers may include an internal electrode layer that is not electrically connected to the first external electrode and the second external electrode.

As shown in FIGS. 2 and 3, the laminated body 11 includes an effective region E in which the internal electrode layers 15 and 16 respectively connected to the first external electrode 12 and the second external electrode 13 are laminated with the dielectric layers 14 located therebetween, and a non-effective region N surrounding the effective region E.

Specifically, the effective region E of the laminated body 11 refers to a region in which portions that define and function as a capacitor are laminated, each including the internal electrode layer 15 electrically connected to the first external electrode 12, the internal electrode layer 16 electrically connected to the second external electrode 13, and the dielectric layers 14 sandwiched between the two internal electrode layers 15 and 16.

In FIGS. 2 and 3, the effective region E of the laminated body 11 refers to an area in which all of the internal electrode layers 15 and 16 overlap each other as viewed in the thickness direction T in the area from an internal electrode layer located closest to the first principal surface 111 among the plurality of internal electrode layers 15 and 16 to an internal electrode layer located closest to the second principal surface 112 among the plurality of internal electrode layers 15 and 16.

The non-effective region N of the laminated body 11 is a portion located outside the effective region E in the laminated body 11, and is a region that does not define and function as a capacitor.

Examples of the material included in each of the plurality of dielectric layers 14 include dielectric ceramics containing, as their main components, $BaTiO_3$, $CaTiO_3$, $SrTiO_3$, $CaZrO_3$, or the like. Further, dielectric ceramics may include the foregoing main components with a Mn compound, a Mg compound, a Si compound, a Co compound, a Ni compound, a rare earth compound or the like added thereto as an accessory component.

Examples of the material included in each of the plurality of internal electrode layers 15 and 16 include a metal, for example, Ni, Cu, Ag, Pd, and Au, or an alloy containing at least one of these metals, for example, an alloy of Ag and Pd.

The first external electrode 12 and the second external electrode 13 each preferably include a base layer provided to cover both ends of the laminated body 11, and a plating layer provided to cover the base layer. Examples of the material included in the base layer include a metal, for example, Ni, Cu, Ag, Pd, and Au, or an alloy containing at least one of these metals, for example, an alloy of Ag and Pd.

Examples of a method of forming the base layer include, for example, a method of baking a conductive paste applied to both ends of the fired laminated body 11, or a method of co-firing a conductive paste applied to both ends of the unfired laminated body 11 at the same time as the internal electrode layer 15 and 16. Alternatively, a method of plating both ends of the laminated body 11 or a method of curing a conductive resin including a thermosetting resin applied to both ends of the laminated body 11 may be adopted.

Examples of the material included in the plating layer include a metal, for example, Sn, Ni, Cu, Ag, Pd, and Au, or an alloy containing at least one of these metals, for example, an alloy of Ag and Pd.

The plating layer may include multiple layers. In this case, the plating layer preferably includes a two-layer structure with a Sn plating layer formed on a Ni plating layer. The Ni plating layer defines and functions as a solder barrier layer. The Sn plating layer provides a favorable wettability to solder.

In the multilayer capacitor built-in substrate 1 shown in FIGS. 2 and 3, the multilayer ceramic capacitor 10 is mounted on the first land electrode L11 and the second land electrode L12 of the core substrate B.

Specifically, the first external electrode 12 and the second external electrode 13 of the multilayer ceramic capacitor 10 are electrically connected, with a solder, a conductive adhesive, or the like which are not shown, respectively to the first land electrode L11 and the second land electrode L12 of the core substrate B.

According to the first preferred embodiment, the thickness $T_R$ of the burying layer is larger than the thickness $T_B$ of the core substrate. Acoustic noise is able to be significantly reduced or prevented by defining the thickness $T_R$ of the burying layer larger to be than the thickness $T_B$ of the core substrate.

According to the first preferred embodiment, when the thickness of the burying layer and the thickness of the core substrate are denoted respectively by $T_R$ and $T_B$, the value of $T_R/T_B$ is preferably about 1.25 or more, for example. In addition, the value of $T_R/T_B$ is preferably about 2.50 or less, for example.

According to the first preferred embodiment, $T_C<L_L/4$ is satisfied when the distance between the first land electrode and the second land electrode in the length direction is denoted by $L_L$, the height of the center of the effective region with the second principal surface of the laminated body as a reference plane is denoted by $T_C$.

As shown in FIG. 2, the distance $L_L$ between the first land electrode L11 and the second land electrode L12 is a length represented by $a+b_1+b_2$ when the interval between the first land electrode L11 and the second land electrode L12 is denoted by a, the length of the first land electrode L11 is denoted by $b_1$, and the length of the second land electrode L12 is denoted by $b_2$.

Figure 4:
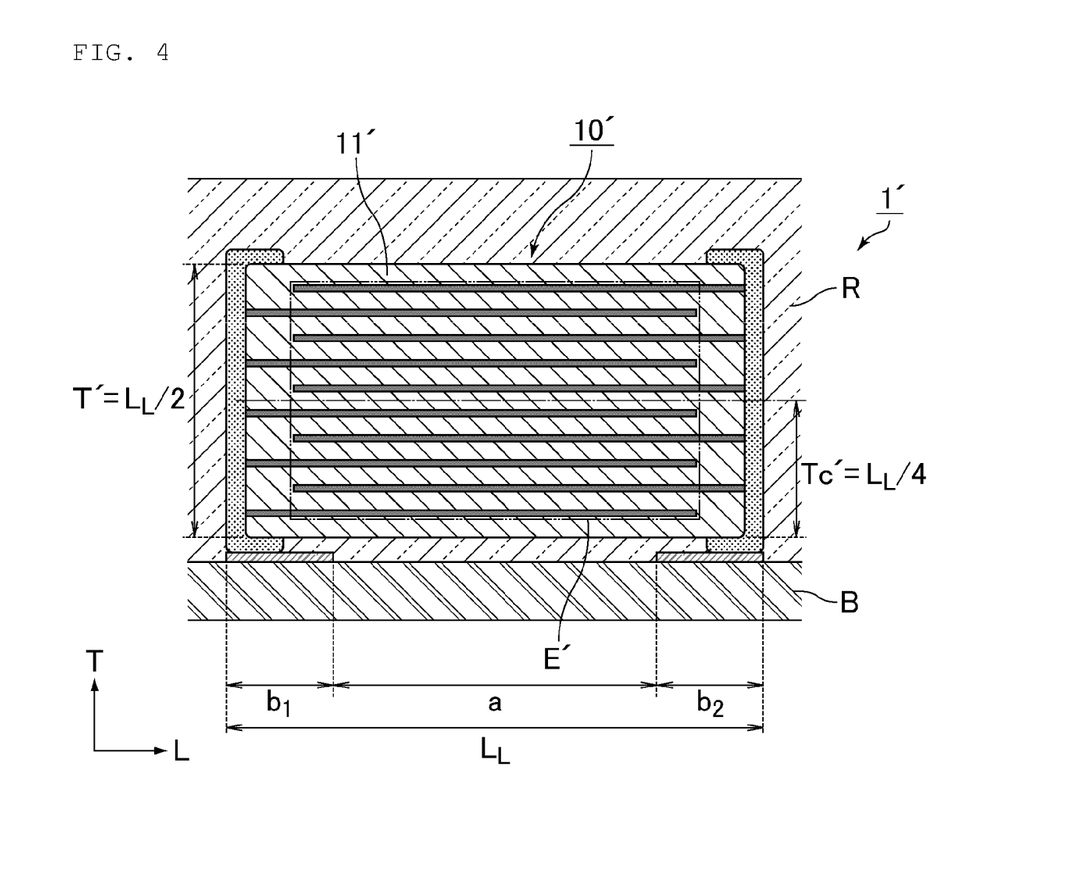
FIG. 4 is a cross-sectional view schematically illustrating an imaginary multilayer capacitor built-in substrate.

FIG. 4 is a cross-sectional view schematically illustrating an imaginary multilayer capacitor built-in substrate.

As shown in FIG. 4, in the imaginary multilayer capacitor built-in substrate 1', it is assumed that the thickness T' of a laminated body 11' of a multilayer ceramic capacitor 10' corresponds to the length represented by $L_L/2$, and the center of an effective region E' coincides with the center of the laminated body 11'. In this case, $T_C'=L_L/4$ is satisfied when the height of the center of the effective region with the second principal surface of the laminated body as a reference plane is denoted by $T_C'$.

According to the first preferred embodiment, acoustic noise is able to be significantly reduced or prevented by satisfying $T_C<L_L/4$. It is to be noted that although there may be an interval between the laminated body and the core substrate, this interval is smaller than the value of $T_C$, and thus considered as providing only a small influence on acoustic noise.

According to the first preferred embodiment, as shown in FIGS. 2 and 3, $T_C<L_L/4$ is satisfied by setting the height $T_C$ of the center of the effective region E to about ¼ or less of the thickness $T_R$ of the burying layer R, for example.

According to the first preferred embodiment, the height $T_C$ of the center of the effective region is preferably about ⅕ or less of the thickness $T_R$ of the burying layer, for example.

According to the first preferred embodiment, when the thickness of the laminated body is denoted by T, and the width of the laminated body is denoted by W, the value of T/W is preferably about ¾ or less, for example. In this specification, the maximum thickness of the laminated body in the thickness direction of the multilayer ceramic capacitor and the maximum width of the laminated body in the width direction are respectively denoted by T and W.

According to the first preferred embodiment, the thickness T of the laminated body is preferably about 0.33 mm or less, for example.

According to the first preferred embodiment of the present invention, as in a second preferred embodiment of the present invention to be described later, the thickness of the non-effective region closer to the second principal surface may be smaller than the thickness of the non-effective region closer to the first principal surface, but the thickness of the non-effective region closer to the second principal surface may be equal or substantially equal to the thickness of the non-effective region closer to the first principal surface, or the thickness of the non-effective region closer to the second principal surface may be larger than the thickness of the non-effective region closer to the first principal surface.

Second Preferred Embodiment

According to the second preferred embodiment of the present invention, the thickness $T_a$ of the non-effective region closer to the second principal surface is smaller than the thickness $T_b$ of the non-effective region closer to the first principal surface.

Figure 5:
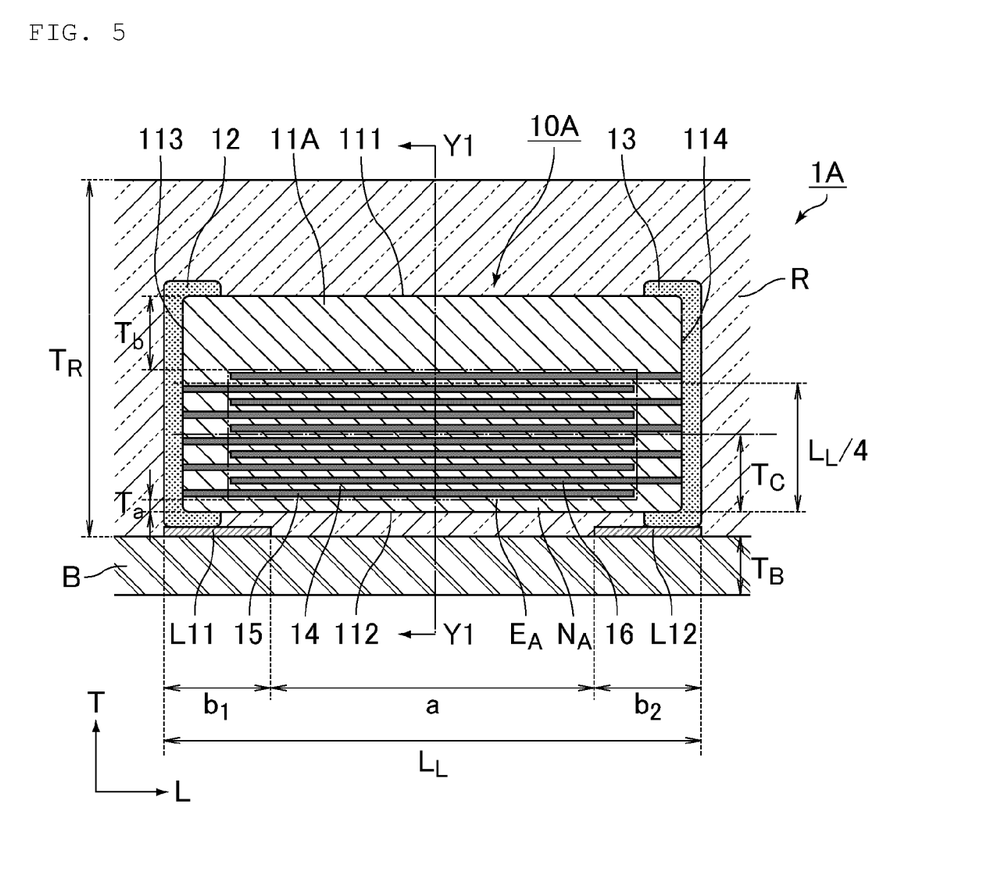
FIG. 5 is a cross-sectional view taken along the line X1-X1 of a multilayer capacitor built-in substrate according to a second preferred embodiment of the present invention.
Figure 6:
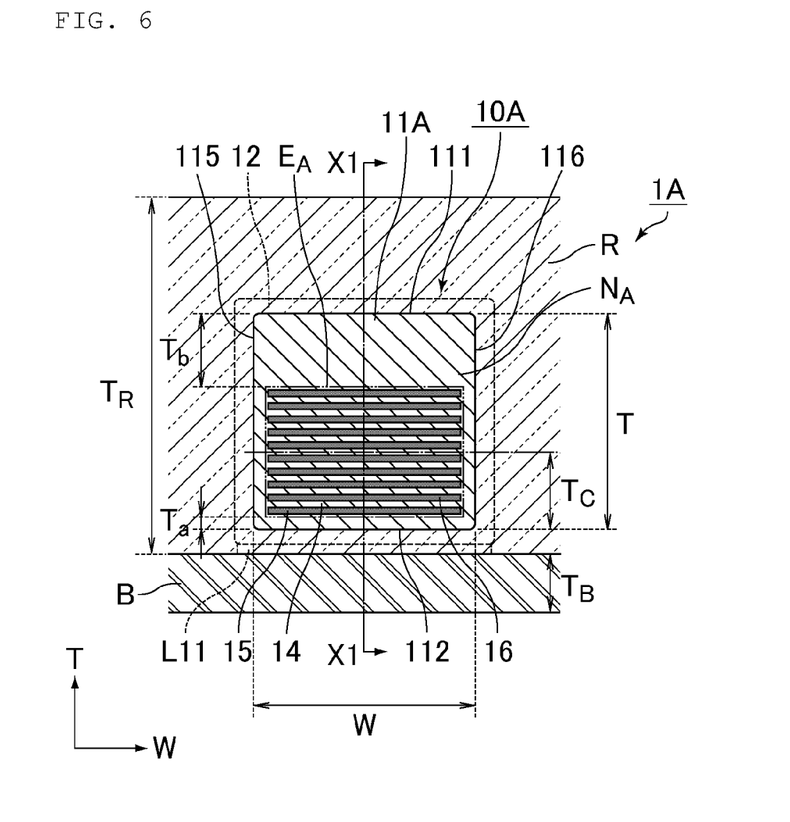
FIG. 6 is a cross-sectional view taken along the line Y1-Y1 of the multilayer capacitor built-in substrate according to the second preferred embodiment of the present invention.

FIG. 5 is a cross-sectional view taken along the line X1-X1 of a multilayer capacitor built-in substrate according to the second preferred embodiment of the present invention. FIG. 6 is a cross-sectional view taken along the line Y1-Y1 of the multilayer capacitor built-in substrate according to the second preferred embodiment. It is to be noted that FIG. 5 corresponds to the cross-sectional view taken along the line X1-X1 of the multilayer capacitor built-in substrate shown in FIG. 1, and FIG. 6 corresponds to the cross-sectional view taken along the line Y1-Y1 of the multilayer capacitor built-in substrate shown in FIG. 1.

The multilayer capacitor built-in substrate 1A shown in FIGS. 5 and 6 includes a core substrate B, a multilayer ceramic capacitor 10A, and a burying layer R. The multilayer ceramic capacitor 10A is mounted on one principal surface of a core substrate B that includes one principal surface and the other principal surface parallel or substantially parallel to each other within the error range. The burying layer R is provided on one principal surface of the core substrate B to bury the multilayer ceramic capacitor 10A, and define the outer surface to be parallel or substantially parallel to the other principal surface of the core substrate B within the error range.

The multilayer capacitor built-in substrate according to the second preferred embodiment includes the same or similar features, components, and elements as the multilayer capacitor built-in substrate according to the first preferred embodiment, except that the multilayer ceramic capacitor includes different features, components, and elements as described herein.

According to the second preferred embodiment, the thickness $T_R$ of the burying layer is larger than the thickness $T_B$ of the core substrate. Acoustic noise is able to be significantly reduced or prevented by making the thickness $T_R$ of the burying layer larger than the thickness $T_B$ of the core substrate.

According to the second preferred embodiment, when the thickness of the burying layer and the thickness of the core substrate are denoted respectively by $T_R$ and $T_B$, the preferable range of the $T_R/T_B$ value is the same as or similar to in the first preferred embodiment.

According to the second preferred embodiment, $T_C < L_L/4$ is satisfied when the distance between the first land electrode and the second land electrode in the length direction is denoted by $L_L$, the height of the center of the effective region with the second principal surface of the laminated body as a reference plane is denoted by $T_C$.

According to the second preferred embodiment, acoustic noise is able to be significantly reduced or prevented as in the first preferred embodiment by satisfying $T_C < L_L/4$.

According to the second preferred embodiment, as shown in FIGS. 5 and 6, $T_C < L_L/4$ is provided by making the thickness $T_a$ of a non-effective region $N_A$ closer to a second principal surface 112 smaller than the thickness $T_b$ of the non-effective region $N_A$ closer to a first principal surface 111.

Figure 7A:
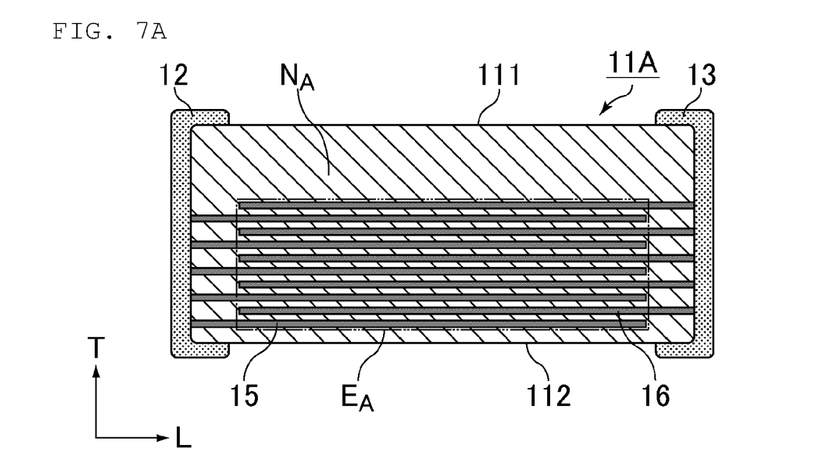
FIGS. 7A, 7B and 7C are explanatory diagrams schematically illustrating an effective region and a non-effective region of a laminated body of a multilayer ceramic capacitor.
Figure 7B:
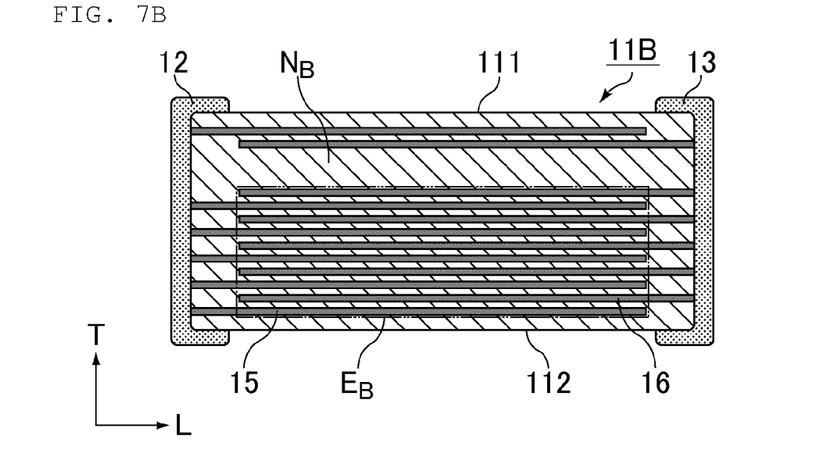
Figure 7C:
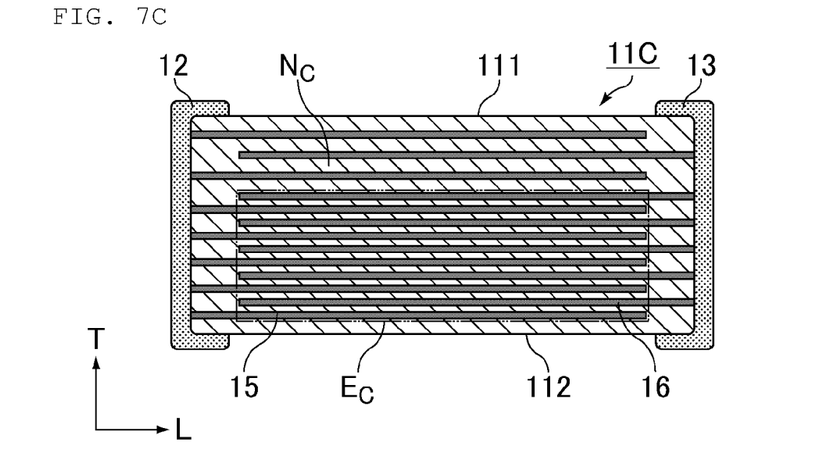

FIGS. 7A, 7B and 7C are explanatory diagrams schematically illustrating an effective region and a non-effective region of a laminated body of a multilayer ceramic capacitor.

As shown in FIG. 7A, when the interval is regular between the internal electrode layer 15 electrically connected to the first external electrode 12 and the internal electrode layer 16 electrically connected to the second external electrode 13, an area in which all of the internal electrode layers 15 and 16 overlap each other as viewed in the thickness direction T in the area from an internal electrode layer located closest to the first principal surface 111 among the plurality of internal electrode layers 15 and 16 to an internal electrode layer located closest to the second principal surface 112 among the plurality of internal electrode layers 15 and 16 is referred to as an effective region $E_A$ of a laminated body 11A. On the other hand, as shown in FIGS. 7B and 7C, when the interval is irregular between the internal electrode layer 15 electrically connected to the first external electrode 12 and the internal electrode layer 16 electrically connected to the second external electrode 13, areas where the internal electrode layers 15 and 16 overlap each other as viewed in the thickness direction T in the area from an internal electrode layer located closest to the first principal surface 111 among the plurality of internal electrode layers 15 and 16 to an internal electrode layer located closest to the second principal surface 112 among the plurality of internal electrode layers 15 and 16 are respectively referred to as an effective region $E_B$ of a laminated body 11B and an effective region $E_C$ of a laminated body 11C, provided that areas are ignored where the intervals are wider between the internal electrode layers 15 and the internal electrode layers 16. After defining the effective regions $E_A$, $E_B$ and $E_C$ as mentioned above, the portions located outside the effective regions $E_A$, $E_B$ and $E_C$ in the laminated bodies are respectively referred to as non-effective regions $N_A$, $N_B$ and $N_C$. Even in the case of the first preferred embodiment, the effective region and non-effective region of the laminated body are able to be defined by the same method or a similar method.

For the measurement of various dimensions, a polished cross section of the multilayer capacitor built-in substrate is enlarged and then observed at, for example, 10-fold magnification with an optical microscope, and the dimension is measured on a straight line passing through the center of the polished cross section. When it is difficult to clearly measure the dimensions with the optical microscope, the polished cross section may be observed with a scanning electron microscope instead of the optical microscope.

For example, in the measurement of the thickness $T_a$ of the non-effective region of the portions located between the second principal surface and the effective region in the laminated body, in an enlarged image of a cross section of the multilayer ceramic capacitor observed with an optical microscope, a straight line is drawn which extends in the laminating direction of the laminated body and passes through the center of the laminated body, and the thickness $T_a$ of the non-effective region on the straight line is measured. Subsequently, in the case of measuring the thickness $T_B$ of the core substrate and the thickness $T_R$ of the burying layer, the thickness $T_B$ of the core substrate and the thickness $T_R$ of the burying layer are measured on the straight line.

The effective region of the laminated body is able to be confirmed by observing the polished cross section with an optical microscope in the same or a similar way as mentioned above. Alternatively, the effective region of the laminated body is able to be confirmed by observing a transmission image captured by irradiating the multilayer capacitor built-in substrate with X-rays from the first principal surface side or the second principal surface side.

A method of manufacturing the multilayer capacitor built-in substrate according to a preferred embodiment of the present invention will be described below.

A method of manufacturing the multilayer capacitor built-in substrate according to a preferred embodiment of the present invention includes the steps of preparing a multilayer capacitor, mounting the multilayer capacitor on one principal surface of a core substrate, and providing, on one principal surface of the core substrate, a burying layer that buries the multilayer capacitor.

This multilayer capacitor built-in substrate is able to be manufactured by, for example, the method described in Japanese Patent Application Laid-Open No. 2016-92176.

EXAMPLES

Examples that more specifically disclose multilayer capacitor built-in substrates according to the preferred embodiments of the present invention will be described below. It should be noted that the present invention is not to be considered limited to only these examples.

According to the following examples and comparative examples, the value of the distance $L_L$ between the first land electrode and the second land electrode in the length direction is about 1.30 mm in Preferred Embodiment Example 1-1, Preferred Embodiment Example 1-2, Preferred Embodiment Example 1-3, and Preferred Embodiment Example 1-4, Preferred Embodiment Example 2-1, Comparative Example 1-1 and Comparative Example 2-1, and about 2.00 mm in Preferred Embodiment Example 1-5, Preferred Embodiment Example 1-6, Preferred Embodiment Example 2-2, Comparative Example 1-2 and Comparative Example 2-2.

In Preferred Embodiment Example 1-1, a multilayer ceramic capacitor with a laminated body of about 0.65 mm in width W and about 0.5 mm in thickness T was prepared, and mounted on one principal surface of a core substrate. Thereafter, a burying layer that buries the multilayer ceramic capacitor mentioned above was formed on one principal surface of the core substrate, thus providing a multilayer capacitor built-in substrate. The thickness $T_R$ of the burying layer is about 1.0 mm, and the thickness $T_B$ of the core substrate is about 0.8 mm.

According to Example 1-1, the height $T_C$ of the center of the effective region is about 0.25 mm, and $T_C<L_L/4$ is thus satisfied.

In Preferred Embodiment Example 1-2, a multilayer capacitor built-in substrate was fabricated similar to Example 1-1, except that a multilayer ceramic capacitor with a laminated body thickness T of about 0.33 mm was prepared. According to Example 1-2, the height $T_C$ of the center of the effective region is about 0.165 mm, and $T_C<L_L/4$ is thus satisfied.

In Preferred Embodiment Example 1-3, a multilayer capacitor built-in substrate was fabricated similar to Example 1-1, except that a multilayer ceramic capacitor with a laminated body thickness T of about 0.2 mm was prepared. According to Example 1-3, the height $T_C$ of the center of the effective region is about 0.1 mm, and $T_C<L_L/4$ is thus satisfied.

In Preferred Embodiment Example 1-4, a multilayer capacitor built-in substrate was fabricated similar to Example 1-1, except that a multilayer ceramic capacitor with a laminated body thickness T of about 0.11 mm was prepared. According to Example 1-4, the height $T_C$ of the center of the effective region is about 0.055 mm, and $T_C<L_L/4$ is thus satisfied.

In Comparative Example 1-1, a multilayer capacitor built-in substrate was fabricated similar to Example 1-1, except that a multilayer ceramic capacitor with a laminated body thickness T of about 0.65 mm was prepared. According to Comparative Example 1-1, the height $T_C$ of the center of the effective region is about 0.325 mm, and $T_C<L_L/4$ is thus not satisfied.

In Preferred Embodiment Example 1-5, a multilayer ceramic capacitor with a laminated body of about 1.0 mm in width W and about 0.8 mm in thickness T was prepared, and mounted on one principal surface of a core substrate. Thereafter, a burying layer that buries the multilayer ceramic capacitor mentioned above was formed on one principal surface of the core substrate, thus providing a multilayer capacitor built-in substrate. The thickness $T_R$ of the burying layer is about 1.2 mm, and the thickness $T_B$ of the core substrate is about 0.8 mm. According to Example 1-5, the height $T_C$ of the center of the effective region is about 0.4 mm, and $T_C<L_L/4$ is thus satisfied.

In Preferred Embodiment Example 1-6, a multilayer capacitor built-in substrate was fabricated similar to Example 1-5, except that a multilayer ceramic capacitor with a laminated body thickness T of about 0.6 mm was prepared. According to Example 1-6, the height $T_C$ of the center of the effective region is about 0.3 mm, and $T_C<L_L/4$ is thus satisfied.

In Comparative Example 1-1, a multilayer capacitor built-in substrate was fabricated similar to Example 1-5, except that a multilayer ceramic capacitor with a laminated body thickness T of about 1.0 mm was prepared. According to Comparative Example 1-2, the height $T_C$ of the center of the effective region is about 0.5 mm, and $T_C<L_L/4$ is thus not satisfied.

In Preferred Embodiment Example 2-1, a multilayer ceramic capacitor with a laminated body of about 0.65 mm in width W, about 0.65 mm in thickness T, about 0.03 mm in the thickness $T_a$ of the non-effective region closer to the second principal surface, and about 0.15 mm in the thickness $T_b$ of the non-effective region closer to the first principal surface was prepared, and mounted on one principal surface of a core substrate. Thereafter, a burying layer that buries the multilayer ceramic capacitor described above was provided on one principal surface of the core substrate, thus providing a multilayer capacitor built-in substrate. The thickness $T_R$ of the burying layer is about 1.0 mm, and the thickness $T_B$ of the core substrate is about 0.8 mm. According to Example 2-1, the height TC of the center of the effective region is about 0.315 mm, and $T_C<L_L/4$ is thus satisfied.

In Comparative Example 2-1, a multilayer capacitor built-in substrate was fabricated similar to Example 2-1, except that a multilayer ceramic capacitor of about 0.15 mm in the thickness $T_a$ of the non-effective region closer to the second principal surface and about 0.03 mm in the thickness $T_b$ of the non-effective region closer to the first principal surface was prepared. According to Comparative Example 2-1, the height TC of the center of the effective region is about 0.435 mm, and $T_C<L_L/4$ is thus not satisfied.

In Preferred Embodiment Example 2-2, a multilayer ceramic capacitor with a laminated body of about 1.0 mm in width W, about 1.0 mm in thickness T, about 0.04 mm in the thickness $T_a$ of the non-effective region closer to the second principal surface, and about 0.15 mm in the thickness $T_b$ of the non-effective region closer to the first principal surface was prepared, and mounted on one principal surface of a core substrate. Thereafter, a burying layer that buries the multilayer ceramic capacitor mentioned above was formed on one principal surface of the core substrate, thereby fabricating a multilayer capacitor built-in substrate. The thickness $T_R$ of the burying layer is about 1.2 mm, and the thickness $T_B$ of the core substrate is about 0.8 mm. According to Example 2-2, the height $T_C$ of the center of the effective region is about 0.445 mm, and $T_C<L_L/4$ is thus satisfied.

In Comparative Example 2-2, a multilayer capacitor built-in substrate was fabricated similar to Example 2-2, except that a multilayer ceramic capacitor of about 0.15 mm in the thickness $T_a$ of the non-effective region closer to the second principal surface and about 0.04 mm in the thickness $T_b$ of the non-effective region closer to the first principal surface was prepared. According to Comparative Example 2-2, the height $T_C$ of the center of the effective region is about 0.555 mm, and $T_C<L_L/4$ is thus not satisfied.

For each Preferred Embodiment Example and each Comparative Example, a reduction of acoustic noise was evaluated by measuring the sound pressure of noise generated from the multilayer capacitor built-in substrate.

Figure 8:
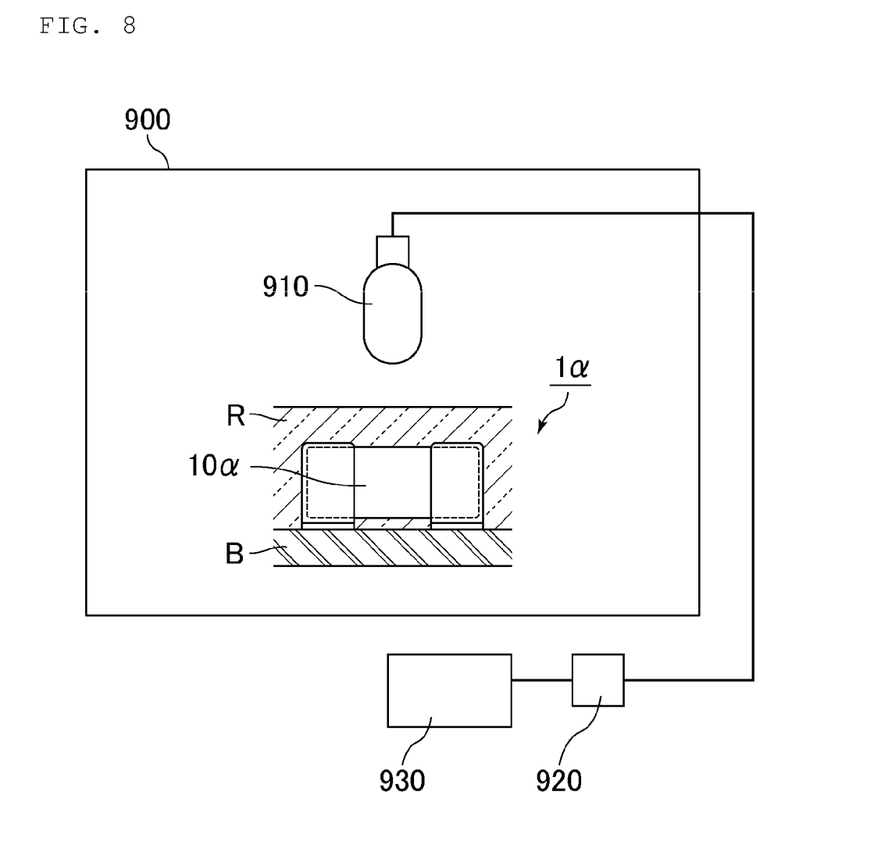
FIG. 8 is a schematic diagram illustrating a method of measuring the sound pressure of noise generated from a multilayer capacitor built-in substrate.

FIG. 8 is a schematic diagram illustrating a method of measuring the sound pressure of noise generated from a multilayer capacitor built-in substrate.

As shown in FIG. 8, for the actual measurement of the sound pressure of noise, in the condition where a multilayer ceramic capacitor 10α was mounted on the core substrate B, and a multilayer capacitor built-in substrate 1α with the multilayer ceramic capacitor 10α buried in the burying layer R was set in an anechoic box 900, a direct-current voltage of 3.0 V and an alternating-current voltage of 1.0 Vpp in the frequency band of 1.5 kHz to 20 kHz were applied to the multilayer ceramic capacitor 10α, and the total sound pressure level of noise generated in that case was measured.

The total sound pressure level of noise was measured by providing a sound collecting microphone 910 in a location about 3 mm above the burying layer R in the anechoic box 900, collecting sounds produced from the multilayer capacitor built-in substrate 1α with the sound collecting microphone 910 and a sound collector 920, and analyzing the collected sounds by a FFT (Fast Fourier Transform) analyzer 930 (CF-5220 from ONO SOKKI Co., Ltd.).

Even in the condition where the multilayer ceramic capacitor 10α prepared according to each Preferred Embodiment Example and each Comparative Example was mounted on the core substrate B without including the burying layer R in place of the multilayer capacitor built-in substrate, in the same or a similar way as mentioned above, the voltages were applied to the multilayer ceramic capacitor, and the total sound pressure level of noise generated in that case was measured. In this regard, in the anechoic box 900, the sound collecting microphone 910 was provided in a location about 3 mm above the multilayer ceramic capacitor 10α.

Figure 9:
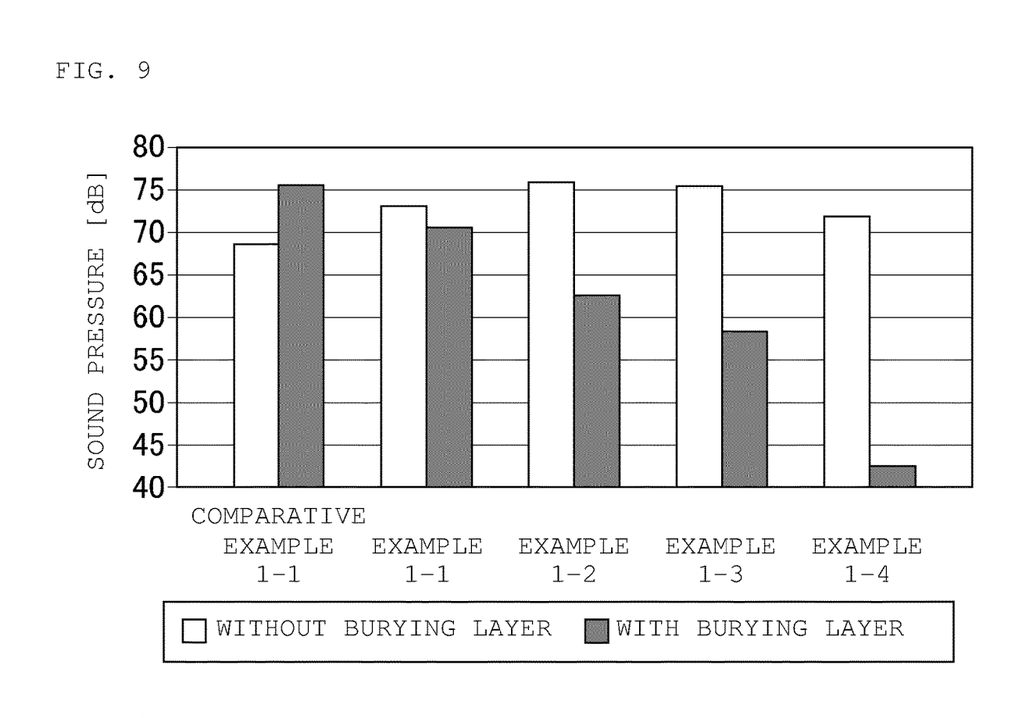
FIG. 9 is a graph showing the results of measuring the sound pressure of noise in Preferred Embodiment Example 1-1, Preferred Embodiment Example 1-2, Preferred Embodiment Example 1-3, Preferred Embodiment Example 1-4, and Comparative Example 1-1.
Figure 10:
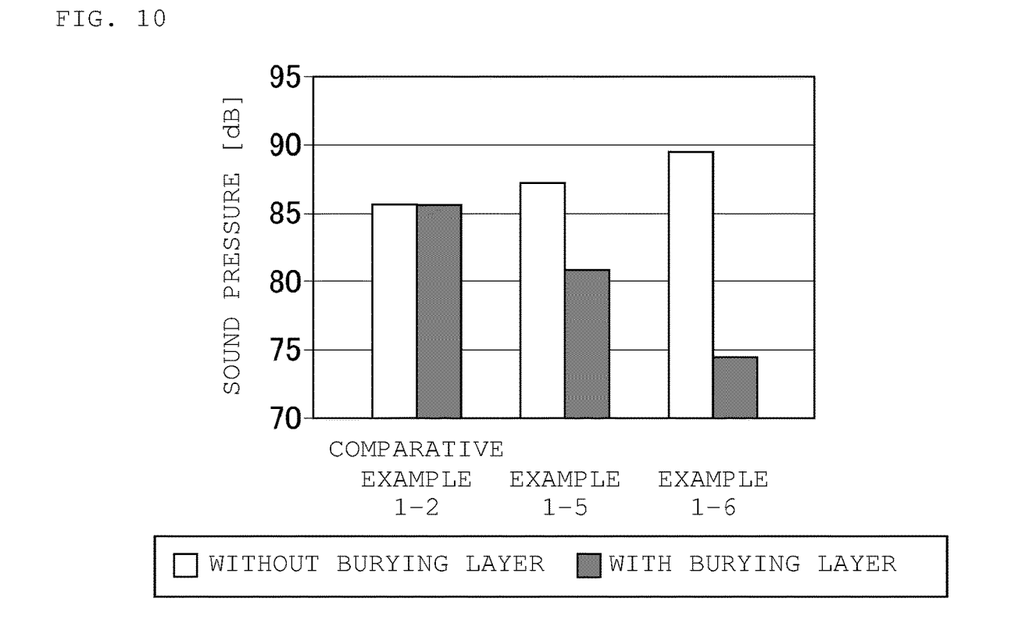
FIG. 10 is a graph showing the results of measuring the sound pressure of noise in Preferred Embodiment Example 1-5, Preferred Embodiment Example 1-6, and Comparative Example 1-2.

FIG. 9 is a graph showing the results of measuring the sound pressure of noise in Preferred Embodiment Example 1-1, Preferred Embodiment Example 1-2, Preferred Embodiment Example 1-3, Preferred Embodiment Example 1-4, and Comparative Example 1-1. FIG. 10 is a graph showing the results of measuring the sound pressure of noise in Preferred Embodiment Example 1-5, Preferred Embodiment Example 1-6, and Comparative Example 1-2.

From FIGS. 9 and 10, it is able to be confirmed that in the condition where the burying layer that buries the multilayer ceramic capacitor is provided, the sound pressure of noise is significantly reduced when the multilayer ceramic capacitor is thin with respect to the burying layer.

Figure 11:
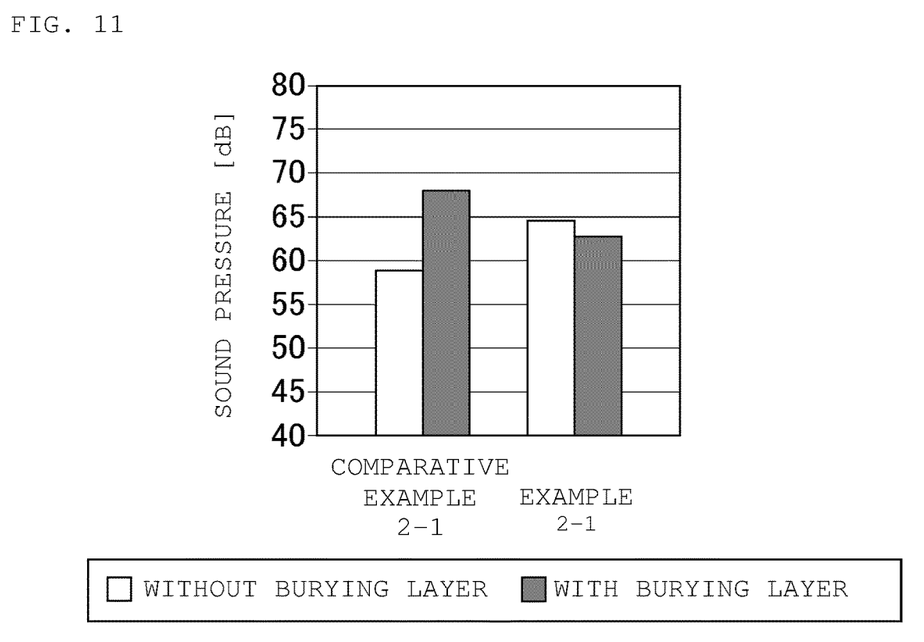
FIG. 11 is a graph showing the results of measuring the sound pressure of noise in Preferred Embodiment Example 2-1 and Comparative Example 2-1.
Figure 12:
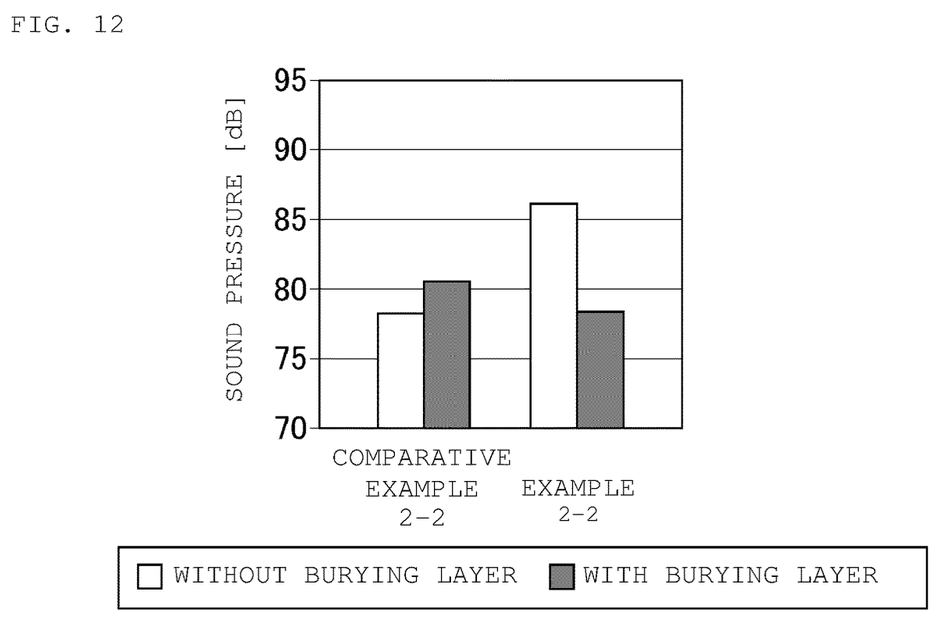
FIG. 12 is a graph showing the results of measuring the sound pressure of noise in Preferred Embodiment Example 2-2 and Comparative Example 2-2.

FIG. 11 is a graph showing the results of measuring the sound pressure of noise in Preferred Embodiment Example 2-1 and Comparative Example 2-1. FIG. 12 is a graph showing the results of measuring the sound pressure of noise in Preferred Embodiment Example 2-2 and Comparative Example 2-2.

From FIGS. 11 and 12, it is able to be confirmed that in the condition where the burying layer that buries the multilayer ceramic capacitor is provided, the sound pressure of noise is significantly reduced when the thickness $T_a$ of the non-effective region closer to the second principal surface is smaller than the thickness $T_b$ of the non-effective region closer to the first principal surface.

While preferred embodiments of the present invention have been described above it is to be understood that variations and modifications will be apparent to those skilled in the art without departing from the scope and spirit of the present invention. The scope of the present invention, therefore, is to be determined solely by the following claims.

What is claimed is:

1. A multilayer capacitor built-in substrate comprising:
a core substrate;
a multilayer capacitor mounted on one principal surface of the core substrate; and
a burying layer provided on the one principal surface of the core substrate to bury the multilayer capacitor; wherein
the multilayer capacitor includes a laminated body with a plurality of dielectric layers and a plurality of internal electrode layers laminated, a first external electrode, and a second external electrode;
the laminated body includes:
a first principal surface opposed in a thickness direction orthogonal or substantially orthogonal to the one principal surface of the core substrate;
a second principal surface opposed in the thickness direction orthogonal or substantially orthogonal to the one principal surface of the core substrate and opposed to the one principal surface of the core substrate;
a first end surface and a second end surface opposed in a length direction orthogonal or substantially orthogonal to the thickness direction; and
a first side surface and a second side surface opposed in a width direction orthogonal or substantially orthogonal to the thickness direction and the length direction;
the first external electrode is provided on the first end surface of the laminated body and electrically connected to at least some of the internal electrode layers of the plurality of internal electrode layers;
the second external electrode is provided on the second end surface of the laminated body and electrically connected to at least some of the internal electrode layers of the plurality of internal electrode layers;
the laminated body includes:
an effective region where the internal electrode layers respectively connected to the first external electrode and the second external electrode are laminated with the dielectric layers located therebetween; and
a non-effective region surrounding the effective region;
the core substrate includes, on the one principal surface, a first land electrode electrically connected to the first external electrode and a second land electrode electrically connected to the first external electrode;
a thickness $T_R$ of the burying layer is larger than a thickness $T_B$ of the core substrate;
$T_C<L_L/4$ is satisfied when a distance between the first land electrode and the second land electrode in the length direction is denoted by $L_L$, and a height of a center of the effective region with the second principal surface of the laminated body as a reference plane is denoted by $T_C$;
the first external electrode includes a Ni plating layer, and a Sn plating layer provided on the Ni plating layer;

the second external electrode includes a Ni plating layer, and a Sn plating layer provided on the Ni plating layer;

the multilayer capacitor is mounted on the one principal surface of the core substrate by a solder or a conductive adhesive that directly connects the first land electrode to the first external electrode and directly connects the second land electrode to the second external electrode;

the height $T_C$ of the center of the effective region is about ⅕ or less of the thickness $T_R$ of the burying layer; and the height $T_c$ of the center of the effective region is disposed between the one principal surface of the core substrate and a distance of half the thickness $T_R$ from the one principal surface of the core substrate.

2. The multilayer capacitor built-in substrate according to claim 1, wherein a value of T/W is about ¾ or less when a thickness of the laminated body and a width of the laminated body are denoted respectively T and W.

3. The multilayer capacitor built-in substrate according to claim 1, wherein a thickness T of the laminated body is about 0.33 mm or less.

4. The multilayer capacitor built-in substrate according to claim 1, wherein a thickness $T_a$ of the non-effective region closer to the second principal surface is smaller than a thickness $T_b$ of the non-effective region closer to the first principal surface.

5. The multilayer capacitor built-in substrate according to claim 1, wherein the burying layer causes the one principal surface of the core substrate to be parallel or substantially parallel to another principal surface of the core substrate.

6. The multilayer capacitor built-in substrate according to claim 1, wherein the burying layer includes a resin material and a glass material.

7. The multilayer capacitor built-in substrate according to claim 6, wherein the burying layer further includes a conductive material portion provided on a surface of the resin material.

8. The multilayer capacitor built-in substrate according to claim 1, wherein the core layer substrate is a multilayer substrate.

9. The multilayer capacitor built-in substrate according to claim 1, wherein the effective region of the laminated body is defined by a cross-sectional area in the thickness direction in which all of the plurality of internal electrode layers overlap each other.

10. The multilayer capacitor built-in substrate according to claim 1, wherein each of the plurality of dielectric layers includes a dielectric ceramic.

11. The multilayer capacitor built-in substrate according to claim 1, wherein the first external electrode includes a first base layer provided on the first end surface, and the Ni plating layer of the first external electrode covers the first base layer; and the second external electrode includes a second base layer provided on the second end surface, and the Ni plating layer of the second external electrode covers the second base layer.

12. The multilayer capacitor built-in substrate according to claim 1, wherein a value of $T_R/T_B$ is greater than about 1.25.

13. The multilayer capacitor built-in substrate according to claim 1, wherein a value of $T_R/T_B$ is less than about 2.50.

14. The multilayer capacitor built-in substrate according to claim 1, wherein at least one of a corner portion and a ridge line portion of the multilayer body is rounded, the corner portion being defined by an intersection of three surfaces of the multilayer body and the ridge line portion being defined by an intersection of two surfaces of the multilayer body.

15. The multilayer capacitor built-in substrate according to claim 1, wherein the laminated body includes a cuboid or substantially cuboid shape.

* * * * *